(12) United States Patent
Morii

(10) Patent No.: US 7,463,503 B2
(45) Date of Patent: Dec. 9, 2008

(54) SEMICONDUCTOR DEVICE

(75) Inventor: Takashi Morii, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 236 days.

(21) Appl. No.: 11/467,675

(22) Filed: Aug. 28, 2006

(65) Prior Publication Data

US 2007/0058461 A1    Mar. 15, 2007

(30) Foreign Application Priority Data

Sep. 14, 2005    (JP)    ............... 2005-266927

(51) Int. Cl.
    *G11C 17/00*    (2006.01)
(52) U.S. Cl. .................... 365/96; 365/225.7
(58) Field of Classification Search .............. 365/96, 365/225.7, 104, 105; 361/56; 347/20, 58
    See application file for complete search history.

(56) References Cited

U.S. PATENT DOCUMENTS

| 4,313,124 A | 1/1982 | Hara ...................... 346/140 R |
| 4,345,262 A | 8/1982 | Shirato et al. ........... 346/140 R |
| 4,459,600 A | 7/1984 | Sato et al. ............... 346/140 R |
| 4,463,359 A | 7/1984 | Ayata et al. ................... 346/1.1 |
| 4,558,333 A | 12/1985 | Sugitani et al. ......... 346/140 R |
| 4,723,129 A | 2/1988 | Endo et al. ................... 346/1.1 |
| 4,740,796 A | 4/1988 | Endo et al. ................... 346/1.1 |
| 5,208,780 A * | 5/1993 | Iwase et al. ............... 365/225.7 |
| 5,610,426 A | 3/1997 | Asai et al. ................... 357/360 |
| 5,898,206 A | 4/1999 | Yamamoto ................... 257/360 |
| 5,900,663 A | 5/1999 | Johnson et al. ............. 257/343 |
| 6,825,543 B2 | 11/2004 | Shimotsusa et al. ......... 257/491 |
| 6,846,734 B2 | 1/2005 | Amos et al. .................. 438/592 |
| 6,948,789 B2 * | 9/2005 | Imanaka et al. ................. 347/9 |
| 7,056,798 B2 | 6/2006 | Shimotsusa et al. ......... 438/301 |
| 7,271,988 B2 * | 9/2007 | Chung et al. ................... 361/56 |
| 2006/0198070 A1 * | 9/2006 | Marr ........................... 361/56 |

FOREIGN PATENT DOCUMENTS

| CN | 1186341 A | 7/1998 |
| CN | 1290403 A | 4/2001 |
| CN | 1503350 A | 6/2004 |
| JP | 59-123670 | 7/1984 |
| JP | 59-138461 | 8/1984 |
| JP | 62-152155 | 7/1987 |
| JP | 2000-343721 | 12/2000 |
| JP | 2002-313942 | 10/2002 |

* cited by examiner

*Primary Examiner*—Vu A Le
(74) *Attorney, Agent, or Firm*—Fitzpatrick, Cella, Harper & Scinto (57) ABSTRACT

A semiconductor device has: a memory element which is arranged on a semiconductor substrate and records information therein; a terminal for inputting first voltage for recording the information to the memory element and second voltage lower than the first voltage for reading out the information from the memory element; and an electrostatic discharge protection circuit which is connected to the terminal. The electrostatic discharge protection circuit includes a diode whose cathode is connected to the first terminal and whose anode is connected to a ground potential, and a first MOS transistor whose drain and gate are connected to the terminal and whose source and back gate are connected to the ground potential.

11 Claims, 6 Drawing Sheets

SEMICONDUCTOR DEVICE

BACKGROUND OF THE INVENTION

1. Field of the Invention

The present invention relates to a semiconductor device having a memory element, and particularly relates to the semiconductor device where an electrostatic discharge protection circuit is provided to a terminal for recording and writing information in the memory element.

2. Description of the Related Art

Conventionally, semiconductor devices where memory elements are arranged on semiconductor substrates have been developing increasingly.

Various applications of the memory elements are present, but they are used in semiconductor devices for liquid discharge. The memory elements are used for recording temperature dependency of liquid discharge property or the residual quantity of liquid in semiconductor devices.

In applications where the large number of bits are not necessary and once-writing is carried out, fuse ROMs are used because of its simplicity of the manufacturing process (see Japanese Patent Application Laid-Open No. 2000-343721). When the fuse ROMs are used, electrostatic discharge protection circuits which prevent electrostatic breakdown caused when a high voltage is applied to input/output terminals due to static electricity (for example, Japanese Patent Application Laid-open No. S62-152155 (1987)).

In the invention of Japanese Patent Application Laid-open No. 2000-343721, at the time of writing in a fuse ROM, the fuse is cut off, but if the high amount of energy is not instantaneously applied to the fuse at this time, cut residue or the like occurs, thereby occasionally causing false detection.

The high electric current should be allowed to flow in order to cut the fuse stably, but in this case, a voltage which is applied to terminals for recording/redding information becomes inevitably high.

On the contrary, at the time of reading information, very high voltage does not have to be applied. Concretely, a voltage of 20 to 30 V is applied to the terminal at the time of writing, and a voltage of several V is applied at the time of reading.

In such a configuration, when the voltage of the terminal changes greatly, a function as electrostatic discharge protection element should be provided without allowing an electric current to flow, and thus there is room to examine the design.

It is an object of the present invention to provide a semiconductor device having an electrostatic discharge protection circuit which is suitable for the case where voltages with large difference is applied.

SUMMARY OF THE INVENTION

A semiconductor device includes: a memory element which is arranged on a semiconductor substrate and records information therein; a terminal for inputting first voltage for recording the information to the memory element and second voltage lower than the first voltage for reading out the information from the memory element; and an electrostatic discharge protection circuit which is connected to the terminal. The electrostatic discharge protection circuit includes a diode whose cathode is connected to the first terminal and whose anode is connected to a ground potential, and a first MOS transistor whose drain and gate are connected to the terminal and whose source and back gate are connected to the ground potential.

A liquid discharge recording head of the present invention has the semiconductor device having the above configuration. A liquid discharge recording device of the present invention has the liquid discharge recording head.

Other features and advantages of the present invention will be apparent from the following description taken in conjunction with the accompanying drawings, in which like reference characters designate the same or similar parts throughout the figures thereof.

DESCRIPTION OF THE EMBODIMENTS

The accompanying drawings, which are incorporated in and constitute a part of the specification, illustrate embodiments of the invention and, together with the description, serve to explain the principles of the invention.

For understanding of the present invention, one example of an electrostatic discharge protection circuit is explained below.

Figure 6:
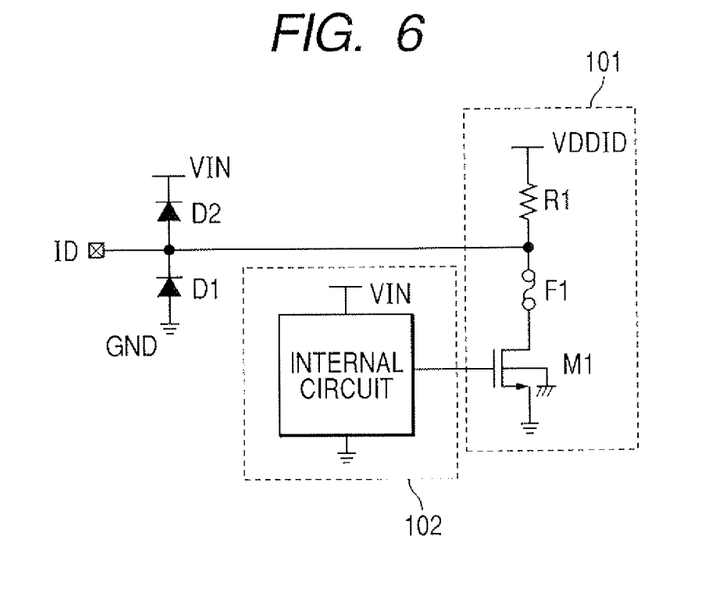
FIG. 6 is a circuit diagram illustrating a conventional embodiment.

FIG. 6 is a sectional view of a semiconductor device having a memory element. As one example of the memory element, a fuse ROM where a large voltage difference is required for writing/reading information is explained.

The application of the present invention is not, however, limited to this, and any memories where a voltage difference between writing and reading is large can be suitably applied thereto.

FIG. 6 is a diagram illustrating a general electrostatic discharge protection circuit (hereinafter ESD protection circuit) of a fuse element according to a clamp diode system.

In FIG. 6, the reference numeral ID denotes an input/output terminal, and D1 denotes a diode element whose anode is connected to a GND line and whose cathode is connected to the input/output terminal ID. The reference character D2 denotes a diode element whose anode is connected to the input/output terminal and whose cathode is connected to an internal applied voltage VIN.

The reference numeral 101 denotes an internal circuit which is protected and it is a fuse-cutting type ROM circuit (hereinafter, a fuse ROM).

VDDID denotes a power source terminal which is used at the time of fuse reading, the reference character F1 denotes a fuse terminal, and the reference character R1 denotes a resistor element for pulling up the input/output terminal ID when the fuse element F1 is cut.

The reference character M1 denotes an N-type power transistor which creates a path from the input/output terminal ID via the fuse F to the GND line when the fuse F is cut.

The N-type power transistor M is a field-effect transistor, namely, for example, an NMOS transistor or an N-type DMOS (defused MOS).

The reference numeral 102 denotes an internal circuit and it is a circuit which controls the N-type power transistor M1 where the internal applied voltage VIN is used as a power source.

An operation of the fuse ROM is explained. At the time of writing, a voltage is applied to the input/output terminal ID so that the N-type power transistor M1 is turned ON. As a result, a high current is allowed to flow in the fuse F1, and the fuse F1 is cut.

At the time of reading, a voltage is applied to the power source terminal VDDID so that the N-type power transistor M1 is turned ON.

When the fuse F1 is cut, an output of the input/output terminal ID becomes a voltage of the power source terminal VDDID. When the fuse F1 is not cut, an output voltage from the input/output terminal ID becomes a GND level.

In the case of the fuse ROM shown in FIG. 6, when an excess voltage due to static electricity is applied to the input/output terminal ID, an excess current is allowed to flow in the fuse F1, so that there is a possibility of false cutting of the fuse F1. As a countermeasure against it, an ESD protection circuit is inserted.

As an operation of the ESD protecting circuit, when a negative excess voltage is applied to the input/output terminal ID, an electric current flows in the input/output terminal ID via the diode element D1 from the GND line. When a positive excess voltage is applied to the input/output terminal ID, an electric current flows in the terminal of the internal applied voltage VIN via the diode element D2 from the input/output terminal ID.

Even when an excess voltage is applied due to static electricity, the electric current does not flow in the internal fuse F1, so that the fuse F1 is protected.

Figure 7:
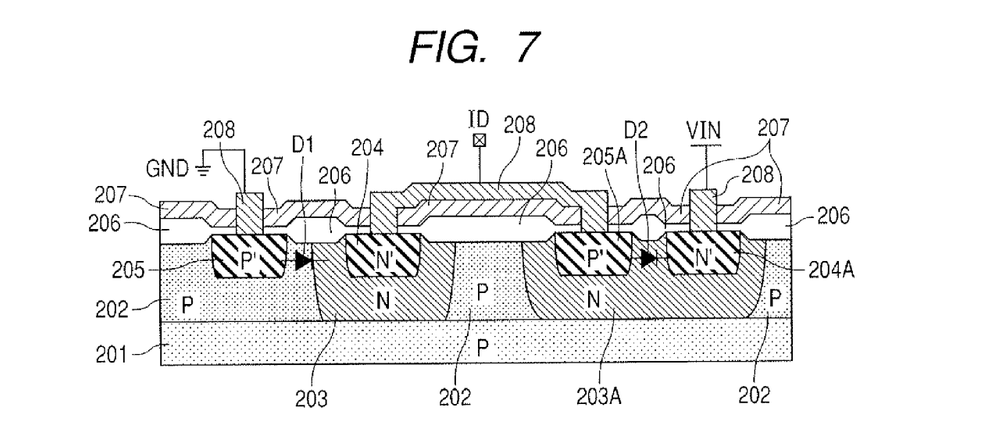
FIG. 7 is a sectional view illustrating a conventional example.

FIG. 7 is a sectional view illustrating a concrete configuration of the protection circuit section shown in FIG. 6.

The reference numeral 201 denotes a P-type low-density (hereinafter, described as P−) semiconductor substrate, the reference numeral 202 denotes a P− semiconductor region, and the reference numeral 203 denotes an N-type low density (hereinafter, described as N−) semiconductor region. They function as cathodes of the diode element D1.

The reference numeral 203A denotes an N− semiconductor region and functions as a cathode of the diode element D2. The 204 denotes an N-type high-density (hereinafter, described as N+) semiconductor region, the reference numeral 204A denotes an N+ semiconductor region, the 205 denotes a P-type high-density (described as P+) semiconductor region, and the 205A denotes a P+ semiconductor region.

The reference numeral 206 denotes an oxidation film, the reference numeral 207 denotes an interlayer insulating film, and the reference numeral 208 denotes a wiring layer made of aluminum or the like.

The diode element D1 in FIG. 6 is composed of the N-semiconductor region 203 to be the cathode and the P− semiconductor region 202 to be the anode. The diode element D2 is composed of the N+ semiconductor region 204A to be the cathode and the P+ semiconductor region 205A to be the anode.

The configuration of FIG. 7 is an example formed by a general CMOS process.

In the case of the above configuration, in order to input a high voltage to the terminal, a voltage to be applied to the internal applied voltage VIN should be set so as to be higher than a voltage to be applied to the input/output terminal ID and be in the vicinity of that voltage.

In such a case, at the time of reading from the fuse ROM, the input/output terminal ID occasionally becomes a several V close to the GND level. At this time, a high voltage can be applied to both ends of the diode element D2.

As shown in FIG. 7, however, a break-down voltage of the diode element D2 is determined by the N− semiconductor region 203A and the P+ semiconductor region 205A. It is difficult to heighten the break-down voltage of the P+ semiconductor region 205A.

In order to avoid this, the number of manufacturing the P− semiconductor region 202 should be increased, thereby causing an increase in the process cost.

Even when a voltage which is applied in order to cut the fuse F1 can be set within a range of the break-down voltage of the diode element D2, the voltage of the input/output terminal ID should be lower than the voltage of the internal applied voltage VIN.

For example, the case where design is done when the internal applied voltage VIN is 5V and the cutting voltage of the fuse F1 is 4V is considered.

Due to a difference of external interfaces or the like, when the internal applied voltage VIN is changed from 5V into 3V, the input/output terminal ID is maintained at 4V. As a result, an electric current flows in the terminal of the internal applied voltage VIN from the input/output terminal ID via the diode element D2.

Also the cutting voltage of the fuse F1 should be, therefore, set to 3 V or less, and thus a cutting condition of the fuse F1 should be redesigned.

On the contrary, the configuration which is the characteristic of the present invention is as follows.

The electrostatic discharge protection circuit includes a diode whose cathode is connected to the first terminal and whose anode is connected to a ground potential, and a first MOS transistor whose drain and gate are connected to the first terminal and whose source and back gate are connected to the ground potential. The electrostatic discharge protection circuit may be disposed at a voltage superimposing path (voltage supplying path) arranged between a terminal and an internal circuit (e.g. memory element). According to this configuration, since the terminal of the ESD protection element is not connected to the power source of the internal circuit, a degree of the design freedom is widened, and thus this configuration can be effectively used even when a difference between the input voltages to the terminals is large.

The feature of the present invention is explained by exemplifying the following embodiments. The present invention is not, however, limited to them, and the embodiments can be combined suitably without departing from the gist of the present invention.

First Embodiment

Figure 1:
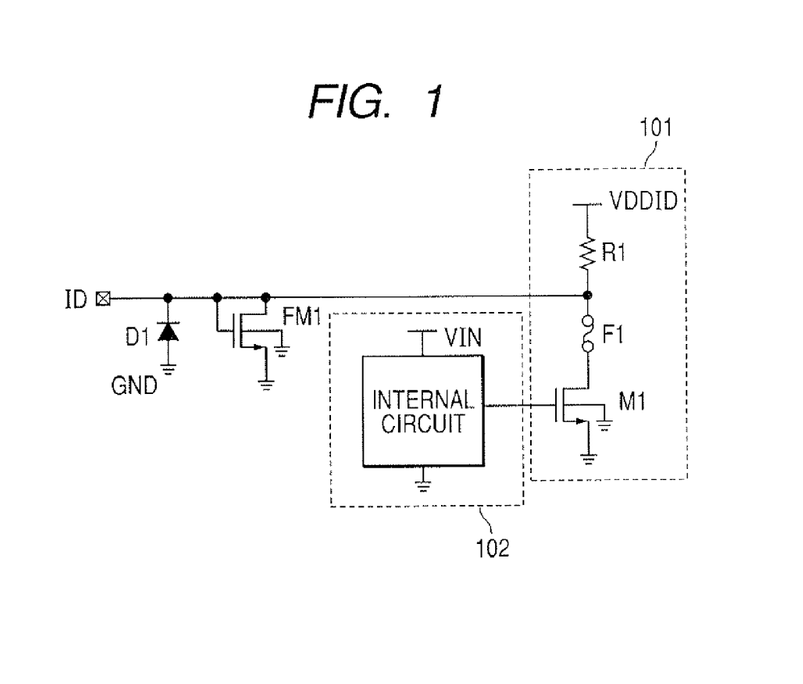
FIG. 1 is a circuit diagram illustrating a first embodiment of the present invention.
Figure 2:
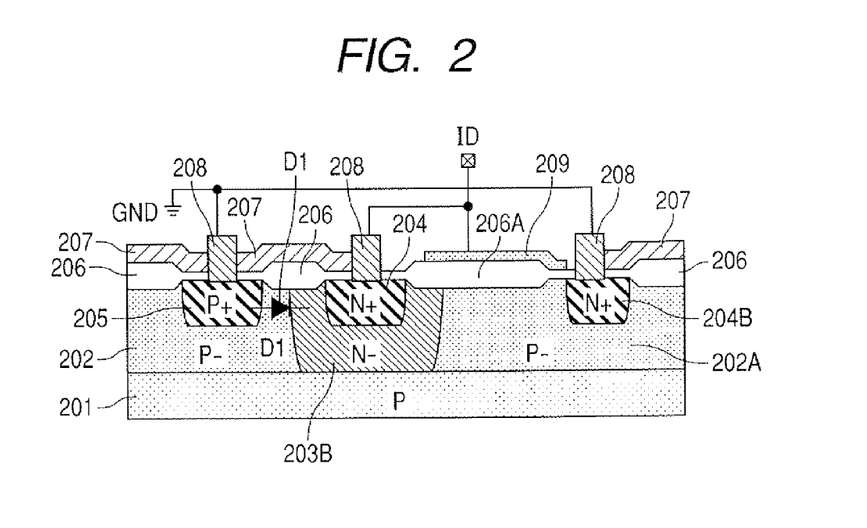
FIG. 2 is a sectional view illustrating a first embodiment of the present invention.

FIG. 1 is a circuit diagram illustrating the configuration of the first embodiment of the present invention, and FIG. 2 is a sectional view illustrating the concrete configuration of the ESD protection circuit section.

In FIG. 1, since the diode element D1, the internal circuit 101 to be protected and the internal circuit 102 are the same as those shown in FIG. 6, the explanation thereof is omitted. A difference in this embodiment is that a field MOS transistor FM1 is used instead of the diode element D2. Wherein, the voltage superimposing path is a wiring connected between one ends of the ID and the F1. Though the wiring, a voltage is supplied from the terminal to the memory element (internal circuit).

In the field MOS transistor FM1, its drain and gate are connected to the input/output terminal ID, and its source and back gate are connected to the GND potential.

In FIG. 2, the same portions as those in the conventional example of FIG. 7 are denoted by the same reference numerals, and the explanation thereof is omitted. The different portions are shown below. The reference numeral 202A denotes a P– diffusion layer region which forms the back gate of the field MOS transistor FM1.

The reference numeral 203B denotes an N– diffusion region which function as both the cathode of the diode element D1 and the drain of the field MOS transistor FM1. The reference numeral 204A denotes an N+ diffusion region which is the source of the field MOS transistor FM1.

The reference numeral 206A denotes a field oxidation film of the field MOS transistor FM1, and the reference numeral 209 denotes a gate electrode of the FM1 made of polysilicon.

An ESD protecting operation of this embodiment is explained below. When a negative excess voltage is applied, similarly to the conventional example, an electric current flows in the input/output terminal ID from the GND potential via the diode element D1.

When a positive excess voltage is applied and the voltage has a threshold or more value of the field MOS transistor FM1, the field MOS transistor FM1 operates, and an electric current flows in the GND terminal from the input/output terminal ID via the field MOS transistor FM1.

That is to say, the function of the ESD protection element is sufficient.

The break-down voltage is explained below. The drain of the field MOS transistor FM1 to be connected to the input/output terminal ID has the same configuration as that of the cathode of the diode element D1.

Since the break-down voltage is determined by N– of the N– diffusion region 203B and P– of the P– diffusion layer regions 202 and 202A, the break-down voltage similar to that of D1 can be obtained.

Since the break-down voltage is determined by the diffusion regions with low density, the sufficient break-down voltage can be obtained.

A threshold voltage of the field MOS transistor FM1 is sufficiently high because the field oxidation film is thick. As a result, the voltage of the input/output terminal ID can be made high, and the high electric current is easily allowed to flow in the fuse F1 so that the fuse F1 can be cut stably.

Even if the internal applied voltage VIN is lowered, the voltage to be applied to the input/output terminal ID does not have to be changed because the input/output terminal ID does not have a system for conducting with the terminal of the internal applied voltage VIN.

For example, the internal applied voltage VIN is 5V, and the cutting voltage of the fuse F1 is 4 V. The internal applied voltage VIN is changed from 5V into 3 V due to a difference in external interfaces or the like. This case is considered.

Also in this case, the cutting voltage of the fuse F1 does not have to be changed, and the examination of the cutting of the fuse F1 does not have to be redesigned.

Second Embodiment

Figure 3:
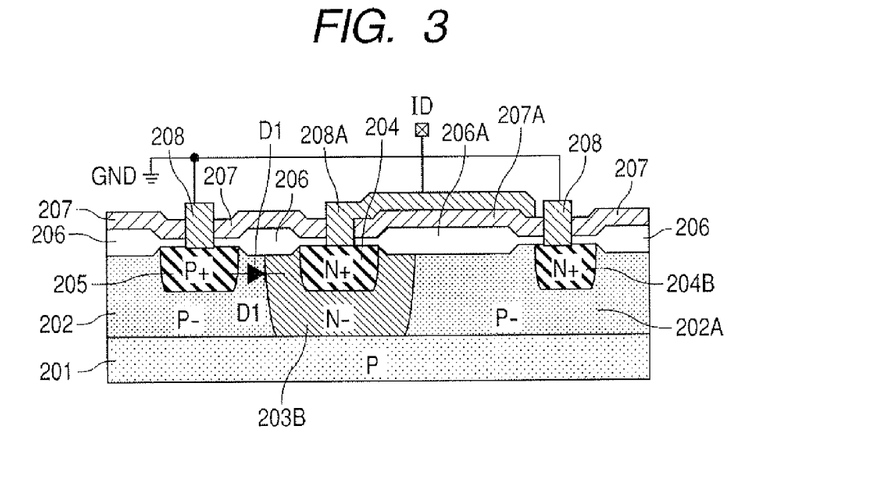
FIG. 3 is a sectional view illustrating a second embodiment of the present invention.

FIG. 3 is a sectional view illustrating a concrete configuration of the ESD protection circuit section according to a second embodiment. Portions which have the same configuration of FIG. 2 are denoted by the same reference numbers as FIG. 2, and explanation thereof is omitted.

In the second embodiment, the difference from FIG. 2 is that an interlayer insulating film 207A is placed on an upper layer of the field oxidation film 206A, and an aluminum wiring layer 208A is used as a gate electrode made of metal.

In the case of a field MOS where polysilicon is used as the gate, the threshold voltage is occasionally lower than the fuse cutting voltage. In order to heighten the threshold voltage, the field oxidation film should be thickened, but the tact of the production process becomes long.

In the second embodiment, therefore, the aluminum wiring layer is used as the gate, so that the thickness of the insulating film under the gate electrode can be larger than the configuration shown in FIG. 2. As a result, the filed MOS with higher threshold voltage can be obtained.

As a result, the applied voltage to the ID terminal at the time of cutting the fuse can be heightened, so that the fuse can be cut more stably.

Third Embodiment

Figure 4:
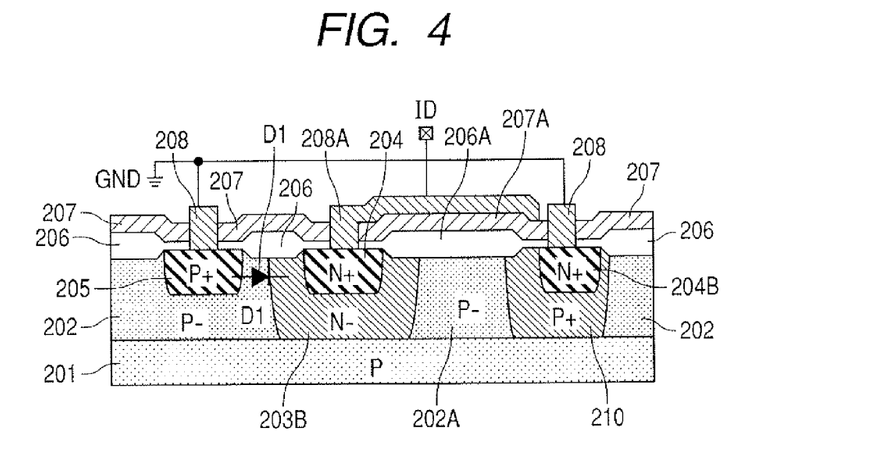
FIG. 4 is a sectional view illustrating a third embodiment of the present invention.

FIG. 4 is a sectional view illustrating the concrete configuration of the ESD protection circuit section according to a third embodiment. Portions which have the same configuration as that of FIG. 3 are denoted by the same reference numbers, and explanation thereof is omitted.

A difference between the third embodiment and the second embodiment is that a P+ base diffusion layer 210 is formed under a channel. This configuration is effective for the semiconductor step of diffusing a base diffusion layer to a lateral direction disclosed in Japanese Patent Application Laid-open No. 2002-313942, for example.

When the base diffusion layer 210 is diffused to the lateral direction, the P+ base diffusion layer 210 is formed under the gate of the field MOS transistor FM1. It is harder than the case of P– that the field MOS transistor FM1 is inverted, so that a channel layer is difficulty created.

As a result, the threshold value can be further heightened, and when the fuse F1 is cut, the voltage to be applied to the input/output terminal ID can be heightened. The fuse can be cut more stably.

Fourth Embodiment

Figure 5:
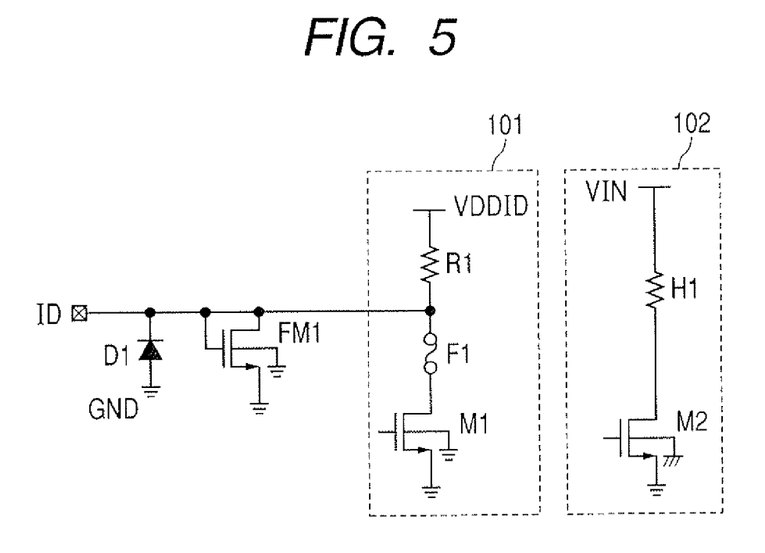
FIG. 5 is a circuit diagram illustrating a fifth embodiment of the present invention.

As an embodiment of the internal circuit shown in FIG. 1, a recording device having an electrothermal conversion element (heater) and its driving circuit is explained below. FIG. 5 is a circuit diagram concretely illustrating the internal circuit 102.

In FIG. 5, the reference character H1 denotes the electrothermal conversion element (heater) and the reference character M2 denotes the driving circuit. This circuit is used for a base substance for ink jet recording. The circuit allows an electric current to flow in the heater, carrying out electrothermal conversion, and foams ink so as to discharge the ink.

An energy at the time of the discharge should be adjusted, and it is effective to store these information in the fuse ROM. When the residual quantity of the liquid is not more than a predetermined value, the fuse ROM can be used also for recording this state.

This configuration is effective particularly for a cartridge where a semiconductor device for liquid discharge is integral with a tank which stores liquid therein.

When the adjustment of the energy is necessary, in general, the power source voltage of a power source line VIN is changed and heat energy generated by the heater is adjusted. In order to increase the discharge rate, the heat energy should be increased, and VIN is heightened.

On the contrary, in order to reduce the discharge rate, the heat energy should be decreased, and VIN is lowered. Since particularly VIN fluctuates, the present invention which uses the field MOS where the fluctuation in VIN does not influence the applied voltage of ID is particularly effective.

Fifth Embodiment

Figure 8:
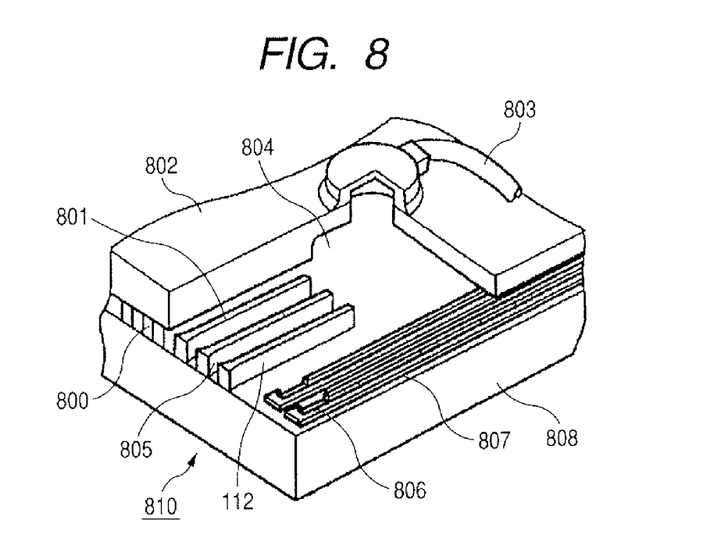
FIG. 8 is a perspective view illustrating a detailed configuration of gas for an ink jet recording head.

The base substance for ink jet recording head (the base substance for liquid discharge recording head) explained in the fourth embodiment is explained below. FIG. 8 is a perspective view illustrating a detailed configuration of the base substance for ink jet recording head.

As shown in FIG. 8, the base substance for ink jet recording head is constituted so that a channel wall member 801 for forming a liquid channel 805 connected to a plurality of discharge ports 800, and a top board 802 having an ink supply port 803 are assembled.

As a result, ink jet recording head (liquid discharge recording head) 810 can be constituted.

In this case, ink injected from the ink supply port 803 is stored in an internal common liquid chamber 804 so as to be supplied to the respective liquid channels 805. In this state, a base substance 808 and a heat generating section 806 are driven so that the ink is discharged from the discharge ports 800.

The recording head 810 shown in FIG. 8 is attached to the ink jet recording device main body, and a signal to be supplied from the device main body to the recording head 810 is controlled. As a result, the ink jet recording device which can realize high-speed recording and high-image quality recording can be provided.

Figure 9:
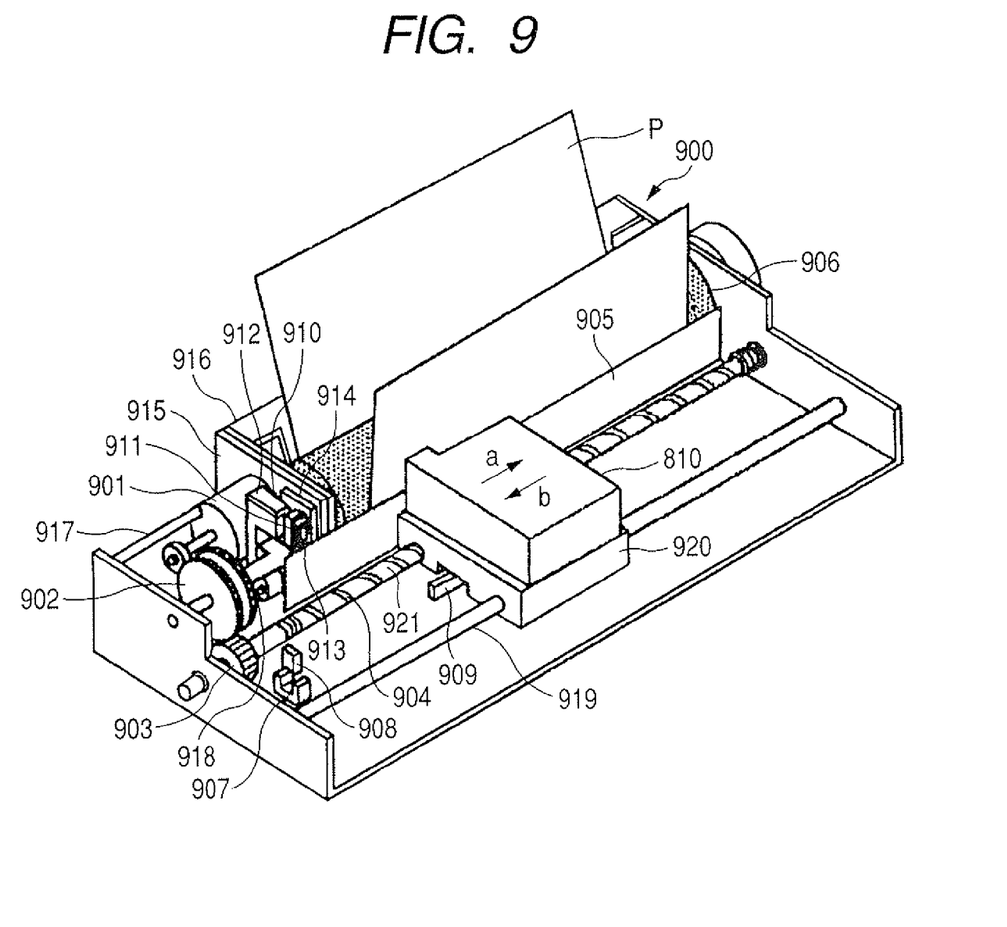
FIG. 9 is an appearance perspective view illustrating an ink jet recording device according to an embodiment of the present invention.

The ink jet recording device (liquid discharge recording device) using the recording head 810 shown in FIG. 8 is explained below. FIG. 9 is an appearance perspective view illustrating the ink jet recording device 900 according to the fifth embodiment of the present invention.

In FIG. 9, the recording head 810 is mounted onto a carriage 920. The carriage 920 is engaged with a spiral groove 921 of a lead screw 904 rotating via drive power transmission gears 902 and 903 in cooperation with normal and reverse rotations of a driving motor 901.

The recording head 810 can move in a reciprocating manner to a direction of arrow "a" or "b" along a guide 919 together with the carriage 920 by the drive power of the driving motor 901.

A sheet retaining plate 905 for recording sheets P conveyed onto a platen 906 by a recording medium feeding device, not shown, presses the recording sheet P against the platen 906 along a carriage moving direction.

Photocouplers 907 and 908 are home position detecting units that check presence of a lever 909 provided to the carriage 920 in regions where the photocouplers 907 and 908 are provided, and switch the rotating direction of the driving motor 901.

A supporting member 910 supports a cap member 911 which caps the entire surface of the recording head 810. A sucking unit 912 sucks the inside of the cap member 911, and the suction of the recording head 810 is recovered via a cap internal opening 513.

A moving member 915 can move a cleaning blade 914 to a front-rear direction, and the cleaning blade 914 and the moving member 915 are supported by a main body supporting plate 916.

It goes without saying that as the cleaning blade 914, not the form shown in the drawing but a publicly-known cleaning blade can be applied to this embodiment.

A lever 917 is provided so as to start the suction of the suction recovery, and moves according to the movement of a cam 918 which is engaged with the carriage 920. The drive power from the driving motor 901 is controlled to be moved by a publicly-known transmission method such as clutch conversion.

A recording control section (not shown), which supplies a signal to the heat generating section 806 provided to the recording head 810 and controls the driving of the respective mechanisms such as the driving motor 901, is provided to the device main body.

The ink jet recording device 900 having the above configuration carries out recording on the recording sheet P conveyed onto the platen 906 by the recording medium feeding device while the recording head 810 is reciprocating along the entire width of the recording sheet P.

Since the recording head 810 is produced by using the base substance for ink jet recording head having the circuit configurations of the above embodiments, high-precision and high-speed recording is enabled.

Figure 10:
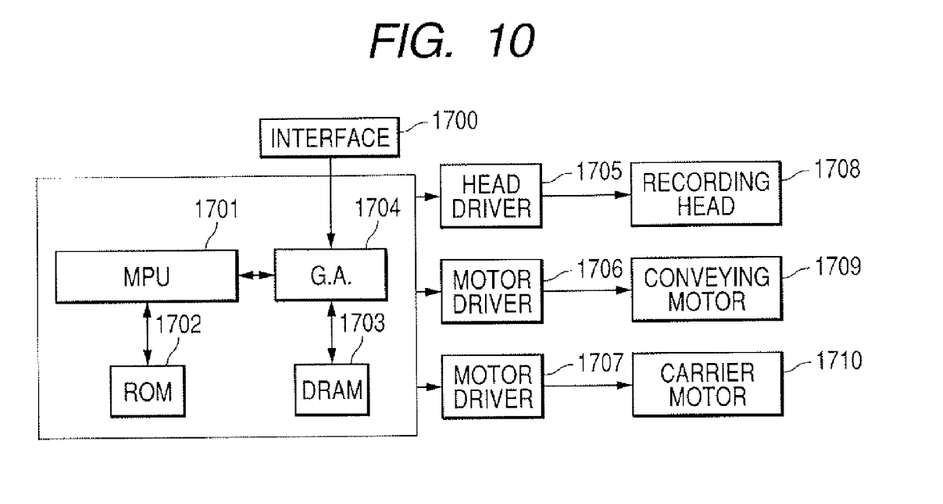
FIG. 10 is a block diagram illustrating a configuration of a control circuit of the ink jet recording device.

The configuration of the control circuit for executing the recording control of the device is explained below. FIG. 10 is a block diagram illustrating the configuration of the control circuit of the ink jet recording device 900.

In FIG. 10 showing the control circuit, the reference numeral 1700 denotes an interface which inputs a recording signal therein, the reference numeral 1701 denotes an MPU, and the reference numeral 1702 denotes a program ROM which stores control programs executed by the MPU 1701.

The reference numeral 1703 denotes a dynamic type RAM which stores various data (the recording signal, recording data and the like to be supplied to the head).

The reference numeral 1704 denotes a gate array that controls supply of the recording data to the recording head 1708, and also controls data transmission among the interface 1700, the MPU 1701 and the RAM 1703.

The reference numeral 1710 denotes a carrier motor that conveys the recording head 1708, and the reference numeral 1709 denotes a conveying motor for conveying a recording sheet.

The reference numeral 1705 denotes a head driver which drives the head, reference numerals 1706 and 1707 denote motor drives which drive the conveying motor 1709 and the carrier motor 1710, respectively.

The operation of the control configuration is explained. When the recording signal enters the interface 1700, the recording signal is converted into recording data for printing between the gate array 1704 and the MPU 1701. The motor drivers 1706 and 1707 are driven, and the recording head is driven according to the recording data transmitted to the head driver 1705, so that printing is carried out.

The above explanation refers to the example where the base substance for ink jet recording head is adopted as the ink jet type recording head. The basic configuration based on the present invention, however, can be applied also to a base substance for thermal head, for example.

The present invention produces the excellent effect in the recording head and the recording device which adopt the system for discharging ink in the ink jet recording system using heat energy which are proposed by the applicants.

As to the typical configuration and principle, basic principles which are disclosed in the specifications of U.S. Pat. Nos. 4,723,129 and 4,740,796 are preferably used.

This method can be applied also to so-called on-demand type and continuous type.

Particularly in the case of the on-demand type, at least one driving signal is applied to an electrothermal conversion element arranged correspondingly to a sheet which maintains liquid (ink) and the liquid channel. The driving signal corresponds to the recording information and causes an abrupt rise in temperature which exceeds boiling.

Heat energy is generated in the electrothermal conversion element by the driving signal, and the film is boiled on a heat effect plane of the recording head. As a result, air bubbles can be formed in liquid (ink) in one-to-one correspondence to the driving signals, and thus this system is effective.

The liquid (ink) is discharged via the discharge opening by growth and deflation of of the air bubbles, so that at least one drop is formed.

When the driving signal has a pulse shape, since the air bubbles are grown and deflated immediately and suitably, the liquid (ink) having particularly excellent response can be discharged more preferably.

As the driving signal having pulse shape, driving signals described in the specifications of U.S. Pat. Nos. 4,463,359 and 4,345,262 are suitable.

When the condition relating to a temperature rise rate of the heat effect plane described in the specification of U.S. Pat. No. 4,313,124 is adopted, more excellent recording can be performed.

The configuration of the recording head includes a configuration where the discharge port, the liquid channel and electrothermal conversion element are combined (linear liquid channel or orthogonal liquid channel) like the above respective specifications.

The present invention includes the configurations described in the specifications of U.S. Pat. Nos. 4,558,333 and 4,459,600 where the heat effect plane is arranged in a curved region.

The present invention is effective in the configuration based on Japanese Patent Application Laid-open No. S59-123670 (1984) where a common slit is used as a discharge portion of the plural electrothermal conversion elements.

The present invention is effective in the configuration based on Japanese Patent Application Laid-open No. S59-138461 (1984) where openings for absorbing a pressure wave of heat energy correspond to discharge portions.

A full-line type recording head having a length corresponding to a width of a maximum recording medium recordable by a recording device is explained below.

When a plurality of recording heads disclosed in the above specifications are combined, the present invention can produce the above effects more effectively in the configuration which satisfies the above length and the configuration where the recording heads are integrated as one head.

Figure 11:
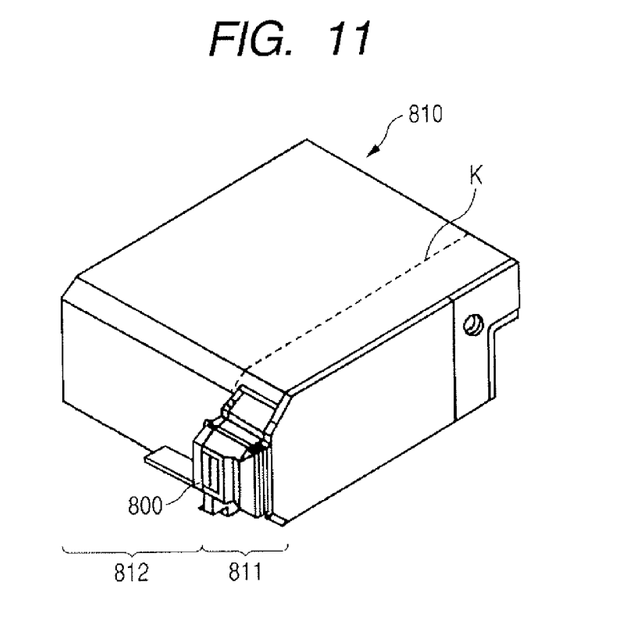
FIG. 11 is an appearance perspective view explaining another embodiment of the ink jet recording head shown in FIG. 10.

As shown in FIG. 11, an ink jet recording head 810 includes a recording head section 811 having a plurality of discharge ports 800, and an ink container 812 which retains ink to be supplied to the recording head section 811.

The ink container 812 is provided detachably to the recording head section 811 along a boundary line K. The ink jet recording head 810 is provided with an electric contact (not shown) which receives an electric signal from the carriage at the time of mounting to the recording device shown in FIG. 9.

A heater is driven by the electric signal. A fibrous or porous ink absorber is provided into the ink container 812 so as to retain the ink. The ink absorber retains the ink.

On the contrary, the ink jet recording head 810 shown in FIG. 11 is constituted so that the recording head 811 is integral with the ink container 812.

The present invention can be applied to the corrected and modified embodiments without departing from the gist.

The present invention may be applied to systems composed of a plurality of instruments (for example, host computer, interface device, reader and printer) or to devices composed of one instrument (for example, copying machine and facsimile device).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-266927, filed Sep. 14, 2005, which is hereby incorporated by reference herein in its entirety.

What is claimed is:

1. A semiconductor device, comprising:
a memory element, which is arranged on a semiconductor substrate and records information therein;
a terminal for inputting a first voltage for recording the information to the memory element and a second voltage lower than the first voltage for reading out the information from the memory element; and
an electrostatic discharge protection circuit,
wherein the electrostatic discharge protection circuit includes a diode whose cathode is connected to the terminal and whose anode is connected to a ground potential, and a first MOS transistor whose drain and gate are connected to the terminal and whose source and back gate are connected to the ground potential.

2. The semiconductor device according to claim 1, wherein the memory element is a fuse ROM.

3. The semiconductor device according to claim 1, wherein the first MOS transistor is a field MOS transistor.

4. The semiconductor device according to claim 2, wherein a first end of the fuse ROM is connected to a second MOS transistor, which operates at a time of recording and reading the information, a second end of the fuse ROM is connected to a first end of a resistor element for pulling up the terminal connected to the fuse ROM at the time of reading, and a second end of the resistor element is connected to a power source to be used at the time of reading the information.

5. The semiconductor device according to claim 3, wherein the field MOS transistor is arranged on a first conductivity type semiconductor substrate, a region of the back gate is composed of a first conductivity type first semiconductor region, the drain is formed of a second conductivity type second semiconductor region, the second semiconductor region is used also as a cathode of the diode, and the source is formed of a second conductivity type third semiconductor region.

6. The semiconductor device according to claim 1, wherein a gate electrode of the MOS transistor is formed of a metal, and is formed on a field oxidation film and an interlayer film.

7. The semiconductor device according to claim 1, wherein, in the MOS transistor, a fourth semiconductor region having a higher impurity density than that of a first conductivity type first semiconductor region is arranged below a field oxidation film.

8. The semiconductor device according to claim 1, further comprising:
an electrothermal conversion element; and
a third MOS transistor for driving the electrothermal conversion element.

9. A semiconductor device according to claim 8, wherein the semiconductor device is incorporated in a liquid discharge recording head.

10. A semiconductor device according to claim 9, wherein the liquid discharge recording head is incorporated in a liquid discharge recording device.

11. A semiconductor device, comprising:
a memory element, which is arranged on a semiconductor substrate and records information therein;
a terminal for inputting a first voltage for recording the information to the memory element and a second voltage lower than the first voltage for reading out the information from the memory element; and
an electrostatic discharge protection circuit,
wherein the electrostatic discharge protection circuit includes a diode whose cathode is connected to a voltage inputting path arranged between the terminal and the memory element and whose anode is connected to a ground potential, and a first MOS transistor whose drain and gate are connected to a voltage inputting path arranged between the terminal and the memory element and whose source and back gate are connected to the ground potential.

* * * * *